United States Patent
Chun et al.

(10) Patent No.: US 9,483,193 B1
(45) Date of Patent: Nov. 1, 2016

(54) DATA STORAGE DEVICE

(71) Applicant: SK hynix Inc., Gyeonggi-do (KR)

(72) Inventors: Dong Yeob Chun, Gyeonggi-do (KR);
Joong Hyun An, Gyeonggi-do (KR);
Kwang Hyun Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/216,017

(22) Filed: Jul. 21, 2016

(30) Foreign Application Priority Data

Jul. 2, 2014 (KR) .......................... 10-2014-0082539

(51) Int. Cl.
*G11C 7/10* (2006.01)
*G06F 3/06* (2006.01)

(52) U.S. Cl.
CPC ........... *G06F 3/0617* (2013.01); *G06F 3/0653* (2013.01); *G06F 3/0679* (2013.01)

(58) Field of Classification Search
CPC .... G11C 7/1072; G11C 7/22; G11C 11/4076
USPC .............................. 365/233.15, 233.17, 229
See application file for complete search history.

(56) References Cited

U.S. PATENT DOCUMENTS

2007/0198757 A1* 8/2007 Kim ...................... G06F 1/3215
710/46

* cited by examiner

*Primary Examiner* — Jason Lappas
(74) *Attorney, Agent, or Firm* — IP & T Group LLP

(57) ABSTRACT

A data storage device includes a first memory device suitable for performing an internal operation in response to a first internal operation command; and a state checking block suitable for performing a state read operation by transmitting a state read command one or more times to the first memory device during one of an initial mode and a repeat mode which is set based on a type of the internal operation.

7 Claims, 9 Drawing Sheets

DATA STORAGE DEVICE

CROSS-REFERENCES TO RELATED APPLICATION

This application is a division of U.S. patent application Ser. No. 14/512,126 filed on Oct. 10, 2014, which claims priority under 35 U.S.C. §119(a) to Korean application number 10-2014-0082539, filed on Jul. 2, 2014. The disclosure of each of the foregoing application is incorporated herein by reference in its entirety.

BACKGROUND

1. Technical Field

Various embodiments generally relate to a data storage device, and more particularly, to a controller which checks completion of an internal operation of a memory device.

2. Related Art

Integrated circuits and semiconductor-based electronic devices are used for a variety of devices, including semiconductor memories. There are two types of semiconductor memories: a nonvolatile type and a volatile type.

Nonvolatile memory devices retain stored data without a power supply. Nonvolatile memory devices include flash memory devices, FeRAM (ferroelectric random access memory) devices, PCRAM (phase change random access memory) devices, MRAM (magnetic random access memory) devices, and ReRAM (resistive random access memory) devices.

The nonvolatile memory device may be used in a system which requires continuous retention of data. For example, the nonvolatile memory device may be used in a digital camera to continuously store images. In another example, the nonvolatile memory device may be used in a digital audio player to continuously store audio data.

SUMMARY

In an embodiment, a data storage device may include: a first memory device suitable for performing an internal operation in response to a first internal operation command; and a state checking block suitable for performing a state read operation by transmitting a state read command one or more times to the first memory device during one of an initial mode and a repeat mode which is set based on a type of the internal operation.

In an embodiment, a data storage device may include: a memory device suitable for performing an internal operation in response to an internal operation command; and a state checking block suitable for determining whether the internal operation is completed, wherein the state checking block comprises: a sequencer suitable for setting a standby time based on an internal operation information, and check passage of the standby time; a pattern generation unit suitable for generating a state read command; and a main control unit suitable for transmitting the state read command to the memory device based on a timing report of the sequencer due to the passage of the standby time.

DETAILED DESCRIPTION

Hereinafter, a data storage device will be described below with reference to the accompanying drawings through various examples of embodiments.

Figure 1:
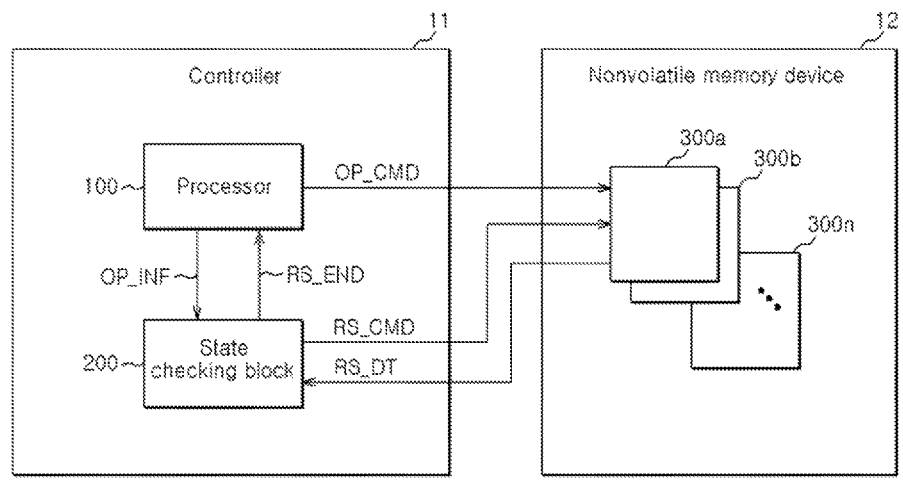
FIG. 1 is a block diagram illustrating a data storage device in accordance with an embodiment.

FIG. 1 is a block diagram illustrating a data storage device 10 in accordance with an embodiment.

The data storage device 10 may store the data provided from an exterior in response to a write request from the exterior. Also, the data storage device 10 may provide stored data to the exterior in response to a read request from the exterior.

The data storage device 10 may be implemented in a Personal Computer Memory Card International Association (PCMCIA) card, a compact flash (CF) card, a smart media card, a memory stick, a multimedia card in the form of an MMC, an eMMC, an RS-MMC and an MMC-micro, a secure digital card in the form of an SD, a mini-SD and a micro-SD, a universal flash storage (UFS), or a solid state drive.

The data storage device 10 may include a controller 11 and a nonvolatile memory device 12.

The controller 11 may control the general operations of the data storage device 10. For example, the controller 11 may control the various internal operations of the nonvolatile memory device 12, such as write, read and erase operations.

The controller 11 may include a processor 100 and a state checking block 200.

The processor 100 may generate internal operation commands respectively corresponding to memory devices 300a to 300n, and may transmit the internal operation commands to the respective memory devices 300a to 300n. For example, FIG. 1 shows the processor 100 transmitting an internal operation command OP_CMD, which is generated for the first memory device 300a, to the first memory device 300a. The internal operation command OP_CMD may be generated according to the type of the internal operation to be performed for the first memory device 300a.

When an internal operation to be performed by the internal operation command OP_CMD is a predetermined operation, for example, write, read, erase, set feature and reset operations, the processor 100 may transmit information for the internal operation (hereinafter, referred to as an "internal operation information OP_INF") to the state checking block 200. The internal operation information OP_INF may include information about the type of internal operation. The internal operation information OP_INF may include information for a memory device in which an internal operation is to be performed, for example, the address of the first memory device 300a to which the internal operation command OP_CMD is transmitted.

The state checking block 200 may recognize one of the memory devices 300a to 300n and the internal operation to be performed, through the transmitted internal operation information OP_INF. The state checking block 200 may transmit a state read command RS_CMD one or more times to the first memory device 300a, in which an internal operation is being performed, during an initial mode or a repeat mode, which is set based on the internal operation information OP_INF. The state checking block 200 may determine whether the internal operation is completed based on response data RS_DT outputted from the first memory device 300a in response to the state read command RS_CMD. The state checking block 200 may transmit a state read end signal RS_END to the processor 100 when it is determined that the internal operation is completed.

The nonvolatile memory device 12 may include the memory devices 300a to 300n. The respective memory devices 300a to 300n may have unique addresses for identification thereof. Each of the memory devices 300a to 300n may perform an internal operation in response to the internal operation command OP_CMD transmitted from the processor 100. Each of the memory devices 300a to 300n may output the response data RS_DT including information indicating completion or incompletion of the internal operation thereof in response to the state read command RS_CMD transmitted from the state checking block 200. For example, the first memory device 300a may perform the internal operation in response to the internal operation command OP_CMD, and may output the response data RS_DT in response to the state read command RS_CMD.

A series of operations for the state checking block 200 to transmit the state read command RS_CMD under the control of the processor 100 and report the completion of an internal operation to the processor 100 through a state read end RS_END during the initial mode or the repeat mode may be defined as a state read operation.

When the processor 100 transmits internal operation commands OP_CMD to the respective memory devices 300a to 300n, the state checking block 200 may perform the state read operations in parallel for the respective memory devices 300a to 300n. In detail, the state checking block 200 may transmit state read commands RS_CMD to the respective memory devices 300a to 300n, based on the internal operation information OP_INF respectively transmitted from the processor 100. The state checking block 200 may determine whether the internal operations of the respective memory devices 300a to 300n are completed, and may report the completion of the internal operations of the respective memory devices 300a to 300n through state read end signals RS_END. The processor 100 may transmit subsequent internal operation commands OP_CMD to memory devices in which the internal operations are completed.

Figure 2:
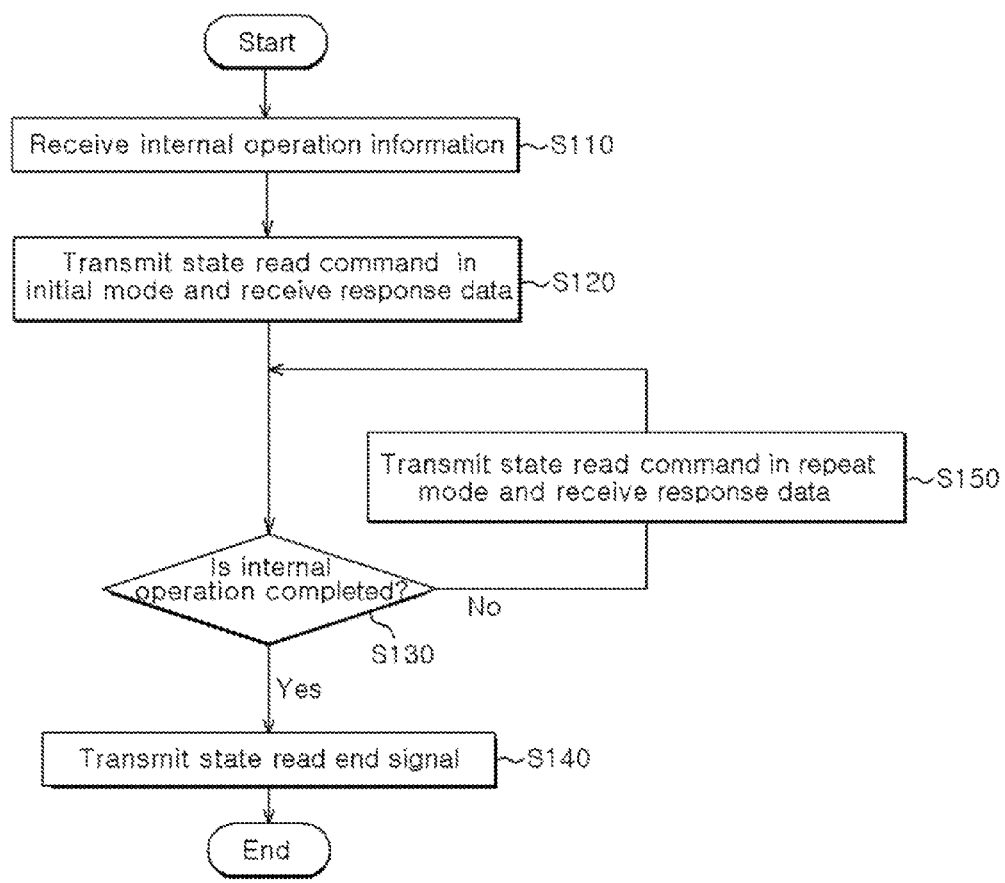
FIG. 2 is a flow chart illustrating an operation of a state checking block shown in FIG. 1.

FIG. 2 is a flow chart illustrating an operation of the state checking block 200 shown in FIG. 1. FIG. 2 shows a process in which the initial mode and the repeat mode are set to the state checking block 200 for the state read operation. Hereafter, an operation of the state checking block 200 to perform the state read operation for the first memory device 300a will be described with reference to FIGS. 1 and 2.

At step S110, the state checking block 200 may receive the internal operation information OP_INF for the first memory device 300a from the processor 100. The state checking block 200 may start the state read operation for the first memory device 300a.

At step S120, the state checking block 200 may transmit the state read command RS_CMD to the first memory device 300a during the initial mode which is set based on the received internal operation information OP_INF. The state checking block 200 may receive the response data RS_DT as a response to the state read command RS_CMD from the first memory device 300a.

At step S130, the state checking block 200 may determine whether the internal operation of the first memory device 300a is completed based on the received response data RS_DT. When it is determined that the internal operation is completed (Yes), the process may proceed to step S140. If it is determined that the internal operation is not completed (No), the process may proceed to step S150.

At the step S140, the state checking block 200 may 1i transmit the state read end signal RS_END to the processor 100. At this time, the state checking block 200 may report to the processor 100, based on the response data RS_DT, whether the result of the internal operation of the first memory device 300a is a success or a fail. The state checking block 200 may end the state read operation for the first memory device 300a.

At the step S150, the state checking block 200 may transmit the state read command RS_CMD to the first memory device 300a during the repeat mode which is set based on the received internal operation information OP_INF. The state checking block 200 may receive the response data RS_DT as a response to the state read command RS_CMD, from the first memory device 300a.

After step S150, the state checking block 200 may return to step S130. That is to say, the state checking block 200 may retain the repeat mode and repeatedly transmit the state read command RS_CMD, until it is determined based on the received response data RS_DT that the internal operation is completed.

Figure 3:
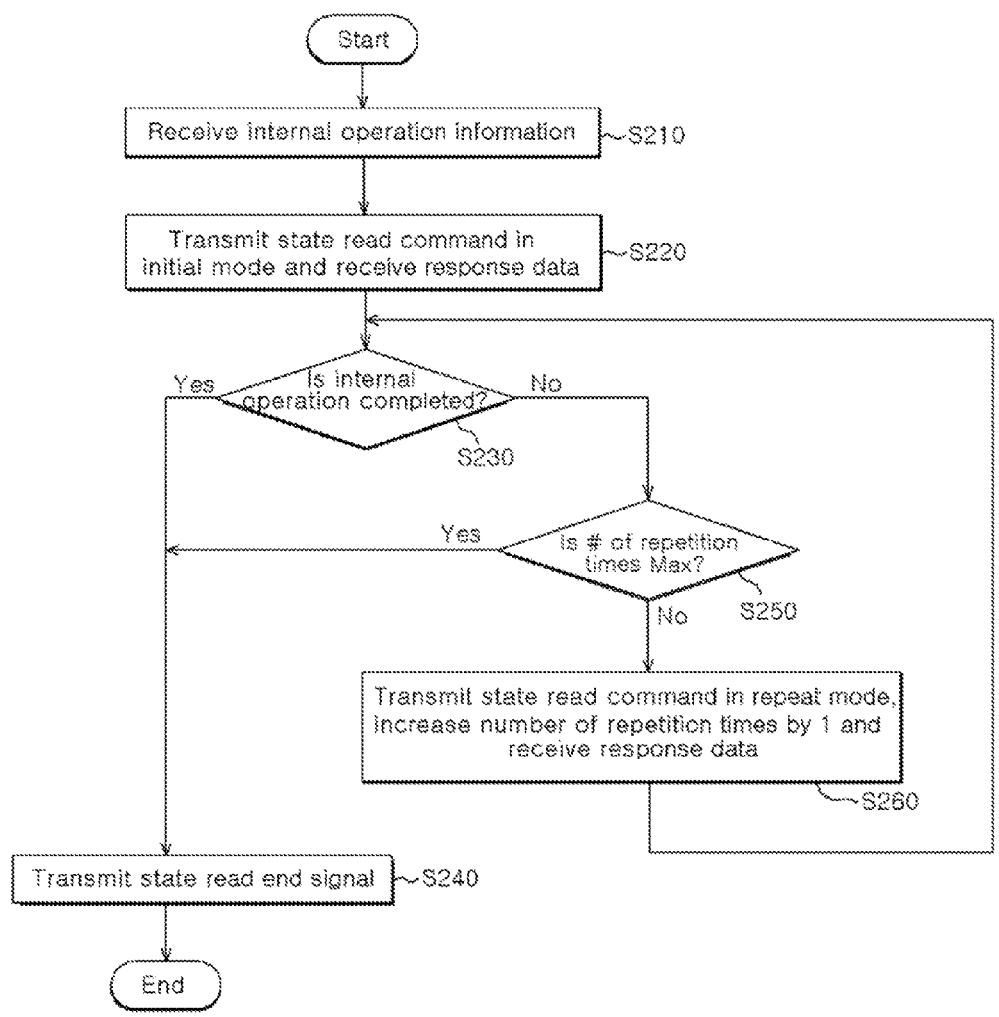
FIG. 3 is a flow chart illustrating another operation of a state checking block shown in FIG. 1.

FIG. 3 is a flow chart illustrating another operation of the state checking block 200 shown in FIG. 1.

The state checking block 200 may prematurely end the state read operation for the memory devices 300a to 300n. Ending the state read operation may be necessary to prevent the state read command RS_CMD from endless repetition of checking the internal operation during the repeat mode when it is impossible to check whether an internal operation is completed due to an error in the memory devices 300a 300n.

The state checking block 200 may end the state read operation when a time-out occurs in each of the memory devices 300a to 300n. The time-out may occur based on at least one of a total time for which the state read operation is performed for each of the memory devices 300a to 300n or the total number of state read commands which are transmitted during the repeat mode.

When the time-out occurs based on a total time for which the state read operation is performed, the state checking block 200 may end the state read operation when the total time for which the state read operation is performed for each of the memory devices 300a to 300n reaches a preset time, even though it is determined that the internal operation of each of the memory devices 300a to 300n, for example, the first memory device 300a, is not completed. The state checking block 200 may transmit the state read end signal RS_END, which includes information indicating the time-out, to the processor 100.

FIG. 3 exemplarily shows an operation of the state checking block 200 for the first memory device 300a when a time-out occurs based on the total number of state read commands which are transmitted during the repeat mode.

The process from step S210 to step S240 may be substantially the same as the process from the step S110 to the step S140 described with reference to FIG. 2. Further, the number of repetition times may be initialized at the step S220. The number of repetition times may be defined as the number of times the state read command RS_CMD is transmitted to the first memory device 300a in the repeat mode.

At step S250, the state checking block 200 may determine whether the number of repetition times reaches a preset number of times. In other words, the state checking block 200 may determine whether a time-out has occurred in the first memory device 300a. When it is determined that the number of repetition times reaches the preset number of times (Yes), the process may proceed to the step S240. At the step S240, the state checking block 200 may transmit the state read end signal RS_END, which includes the information indicating the time-out, to the processor 100. When it is determined that the number of repetition times does not reach the preset number of times (No), the process may proceed to the step S260.

At the step S260, the state checking block 200 may transmit the state read command RS_CMD to the first memory device 300a during the repeat mode which is set based on the received internal operation information OP_INF. Then, the state checking block 200 may increase the number of repetition times by 1. The state checking block 200 may receive the response data RS_DT as a response to the state read command RS_CMD from the first memory device 300a. Then, the process may return to the step S230. That is to say, the state checking block 200 may retain the repeat mode and repeatedly transmit the state read command RS_CMD, until it is determined based on the received response data RS_DT that the internal operation is completed, or until the number of repetition times reaches the preset number of times.

Summarizing, when it is determined that the internal operation is not completed, the state checking block 200 may repeatedly transmit the state read command RS_CMD by the preset number of times at maximum during the repeat mode.

Figure 4:
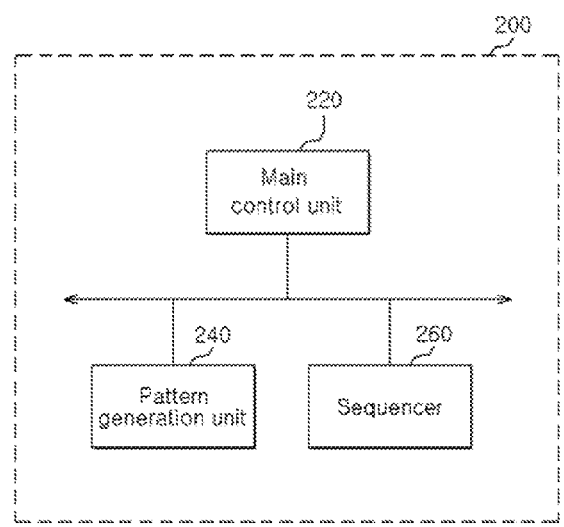
FIG. 4 is a block diagram illustrating a state checking block shown in FIG. 1.

FIG. 4 is a block diagram illustrating the state checking block 200 shown in FIG. 1.

The state checking block 200 may include a main control unit 220, a pattern generation unit 240, and a sequencer 260.

The main control unit 220 may control the pattern generation unit 240 and the sequencer 260 in such a manner that the state read operation is performed based on the received internal operation information OP_INF. The main control unit 220 may transmit the state read command RS_CMD to the memory devices 300a to 300n at an appropriate timing through the timing management by the sequencer 260 which will be described below. The main control unit 220 may transmit the state read end signal RS_END to the processor 100 when the sequencer 260 reports the end of the state read operation.

The pattern generation unit 240 may generate the state read command RS_CMD under the control of the sequencer 260. The pattern generation unit 240 may generate various kinds of state read commands RS_CMD which are configured by different patterns.

The sequencer 260 may manage the general process of the state read operation. The sequencer 260 may manage the progress information of state read operations for the respective memory devices 300a to 300n.

Figure 5:
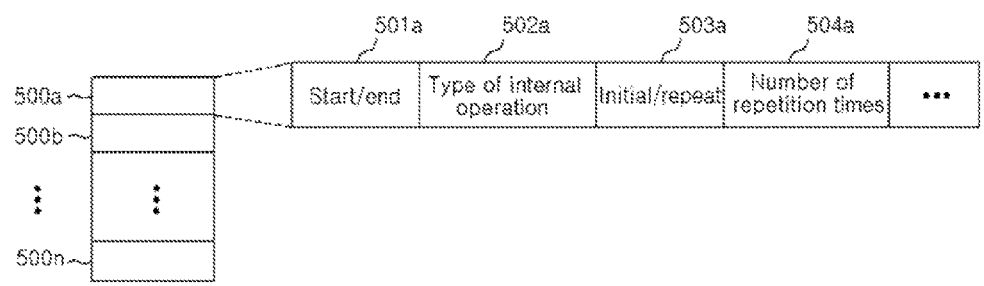
FIG. 5 is a schematic diagram illustrating examples of registers.

FIG. 5 is a schematic diagram illustrating examples of registers 500a to 500n for the sequencer 260 to store and manage progress information for state read operations. The sequencer 260 may store the progress information for the memory devices 300a to 300n in the registers 500a to 500n, respectively, and may manage the progress information. FIG. 5 exemplarily shows the first register 500a in which the progress information of the state read operation for the first memory device 300a is stored.

The first register 500a may include first to fourth regions 501a, 502a, 503a and 504a. The first region 501a may store information which represents the start of the state read operation for the first memory device 300a. The second region 502a may store information for an internal operation which is being performed. The third region 503a may store information which represents that the first memory device 300a is set to the initial mode or the repeat mode. The fourth region 504a may store the number of repetition times which is increased by 1 each time the state read command RS_CMD is transmitted to the first memory device 300a during the repeat mode.

Referring again to FIG. 4, the sequencer 260 may set an initial standby time during the initial mode. The initial standby time may be set in consideration of an expected performance time of the internal operation, to prevent unnecessary or excessive transmission of the state read command RS_CMD. The sequencer 260 may set a repeat standby time during the repeat mode. The repeat standby time may be an interval between timings at which the state read command RS_CMD is transmitted in the repeat mode. The sequencer 260 may set the repeat standby time to be shorter than the initial standby time.

Because the performance times of internal operations may be different from one another according to the types of the internal operations, the sequencer 260 may set different initial standby times or different repeat standby times based on the types of the internal operations. For example, the performance time of a write operation may be longer than the performance time of a read operation, and therefore the sequencer 260 may set an initial standby time for the write operation to be longer than an initial standby time for the read operation. The following table shows initial standby times and repeat standby times set by the sequencer 260 according to the types of the internal operations.

| Type of internal operation | Write | Read | Erase | Set feature | Reset |
|---|---|---|---|---|---|
| Initial standby time | FT_WT | FT_RD | FT_ER | FT_ST | FT_RE |
| Repeat standby time | RT_WT | RT_RD | RT_ER | RT_ST | RT_RE |

The sequencer 260 may notify timings, at which the state read command RS_CMD is transmitted, to the main control unit 220 based on an initial standby time and a repeat standby time. In detail, the sequencer 260 may report transmission timing of the state read command RS_CMD to the main control unit 220 when the initial standby time passes during the initial mode. The sequencer 260 may report transmission timing of the state read command RS_CMD to the main control unit 220 when the repeat standby time passes during the repeat mode. The sequencer 260 may control a timing controller (not shown) which is configured to check the passage of the initial standby time or the repeat standby time through counting of clocks.

The sequencer 260 may determine whether to continuously perform the state read operation based on the response data RS_DT outputted from the memory devices 300a to 300n in response to the state read command RS_CMD. The sequencer 260 may determine to continuously perform the state read operation when it is determined, based on the response data RS_DT, that the internal operation is not completed. In this case, the sequencer 260 may change the setting from the initial mode to the repeat mode or continuously retain the repeat mode, and may repeatedly transmit the state read command RS_CMD each time the repeat standby time passes.

The sequencer 260 may end the state read operation and report the end of the state read operation when it is determined, based on the response data RS_DT, that the internal operation is completed. The sequencer 260 may report the cause for the end of the state read operation, for example, end by completion of the internal operation or end by the occurrence of a time-out. The sequencer 260 may report whether the result of the internal operation is a success or a failure to the main control unit 220. Such a report by the sequencer 260 may be transmitted to the processor 100 by the main control unit 220.

Figure 6:
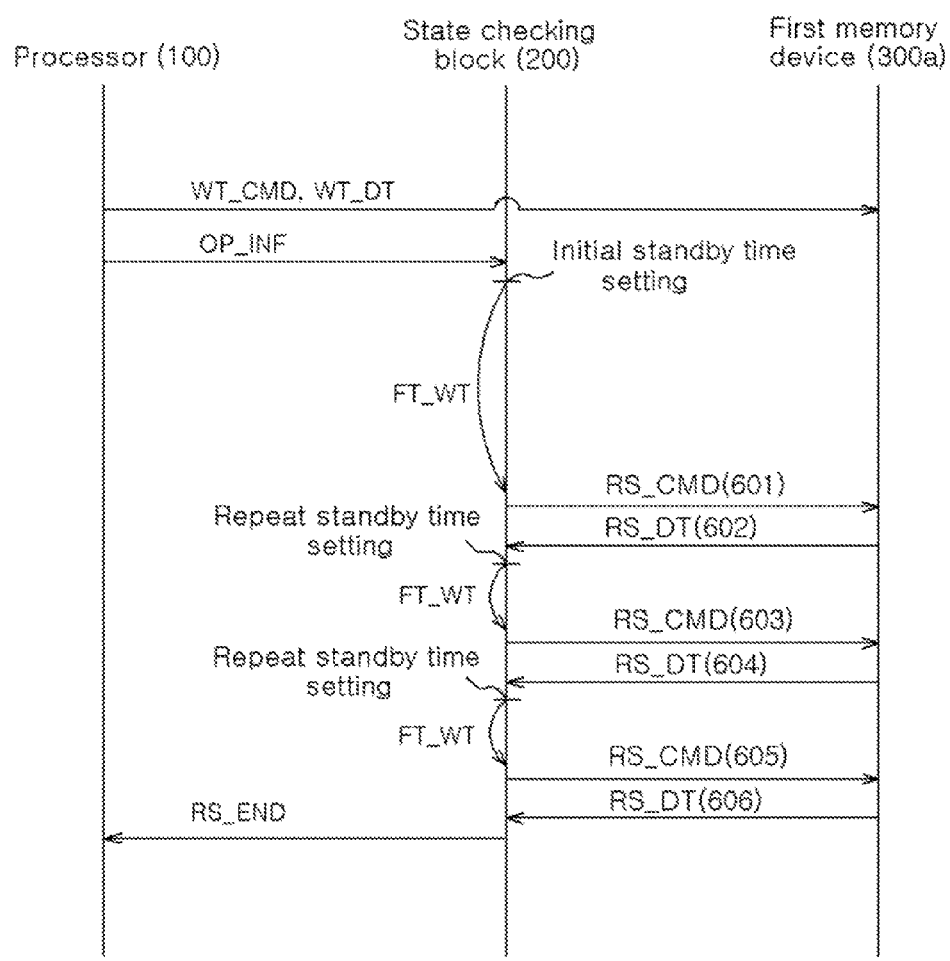
FIG. 6 is a transaction diagram illustrating an operation of a data storage device shown in FIG. 1.

FIG. 6 is a transaction diagram illustrating an operation of the data storage device 10 shown in FIG. 1. Hereafter, the operation of the data storage device 10 will be described in detail with reference to FIGS. 1, 4 and 6.

The processor 100 may transmit an internal operation command OP_CMD, for example, a write operation command WT_CMD and data WT_DT to be stored, to one of the memory devices 300a to 300n, for example, the first memory device 300a. The processor 100 may transmit the internal operation information OP_INF to the state checking block 200.

The state checking block 200 may start the state read operation for the first memory device 300a in response to the internal operation information OP_INF. The sequencer 260 may identify that the type of the internal operation is a write operation, and may set the initial standby time FT_WT corresponding to the write operation during the initial mode. When the initial standby time FT_WT passes, the sequencer 260 may report the transmission timing of the state read command RS_CMD to the main control unit 220, and the main control unit 220 may transmit the state read command RS_CMD 601 to the first memory device 300a.

The first memory device 300a may output response data RS_DT 602 in response to the state read command RS_CMD.

The sequencer 260 may continuously perform the state read operation when it is determined, based on the received response data RS_DT, that the internal operation is not completed. The sequencer 260 may set the repeat standby time RT_WT corresponding to the write operation in the repeat mode. If the repeat standby time RT_WT passes, the sequencer 260 may report the transmission timing of the state read command RS_CMD to the main control unit 220, and the main control unit 220 may transmit the state read command RS_CMD 603 to the first memory device 300a.

The first memory device 300a may output response data RS_DT 604 in response to the state read command RS_CMD.

The sequencer 260 may continuously perform the state read operation, when it is determined based on the received response data RS_DT that the internal operation is not completed. The sequencer 260 may retain the repeat mode, and may reset the repeat standby time RT_WT. When the repeat standby time RT_WT passes, the sequencer 260 may report the transmission timing of the state read command RS_CMD to the main control unit 220, and the main control unit 220 may transmit a state read command RS_CMD 605 to the first memory device 300a.

The first memory device 300a may output response data RS_DT 606 in response to the state read command RS_CMD.

The sequencer 260 may report the end of the state read operation to the main control unit 220 when it is determined based on the response data RS_DT that the internal operation is completed. The main control unit 220 may transmit the state read end signal RS_END to the processor 100.

Figure 7:
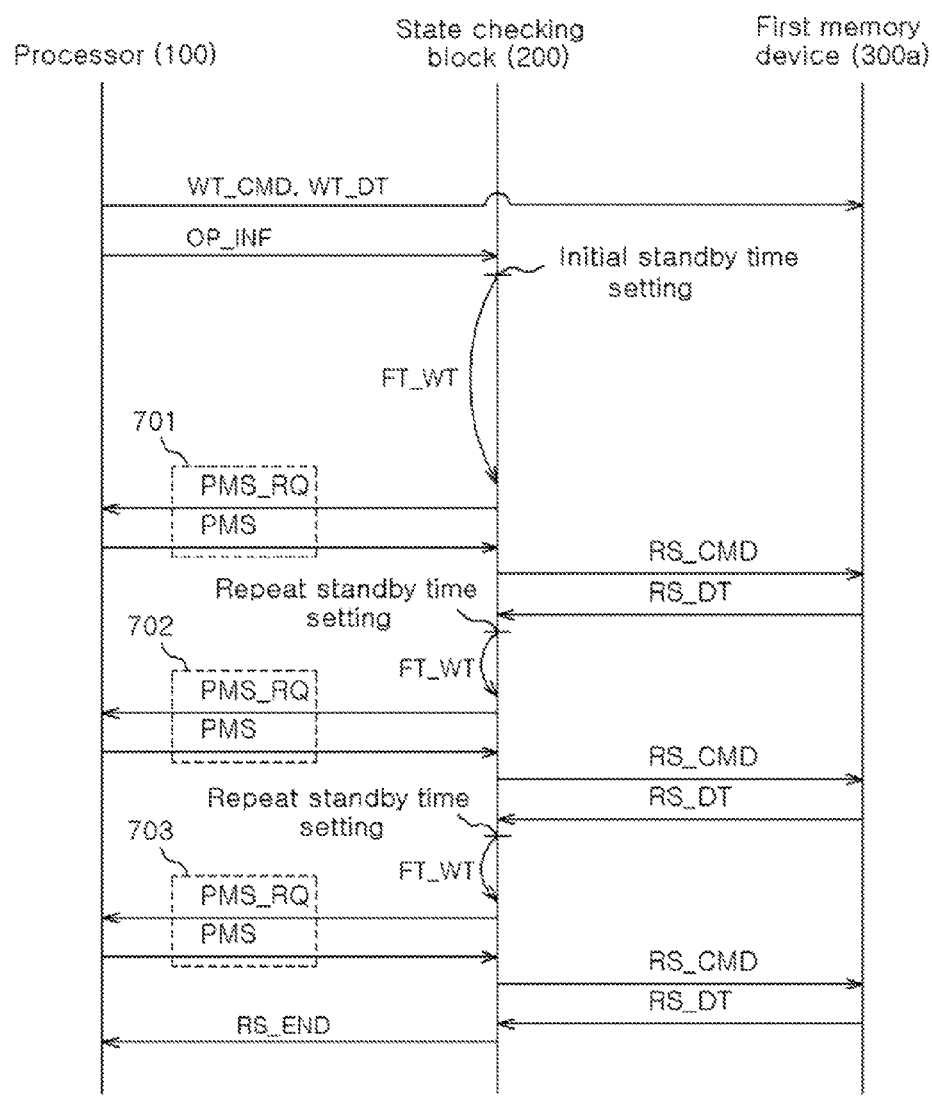
FIG. 7 is a transaction diagram illustrating an operation of a data storage device shown in FIG. 1.

FIG. 7 is a transaction diagram illustrating an operation of the data storage device 10 shown in FIG. 1. The operation of the data storage device 10 shown in FIG. 7 may be substantially the same as the operation of the data storage device 10 described with reference to FIG. 6 except a permission process 701 to 703 performed between the state checking block 200 and the processor 100. Hereafter, the operation of the data storage device 10 will be described in detail with reference to FIGS. 1, 4 and 7, and differences from the operation of the data storage device 10 described with reference to FIG. 6 will be preferentially described.

When the state checking block 200, the first memory device 300a and the processor 100 share a data bus, the permission process 701 to 703 may be performed for the processor 100 before transmitting the state read command RS_CMD through the data bus. In detail, the sequencer 260 may report the transmission timing of the state read command RS_CMD to the main control unit 220 when the initial standby time FT_WT or the repeat standby time RT_WT passes, and then, the main control unit 220 may output a permission request signal PMS_RQ to the processor 100. Only when the processor 100 outputs a permission signal PMS in response to the permission request signal PMS_RQ may the main control unit 220 transmit the state read command RS_CMD to the first memory device 300a.

Figure 8:
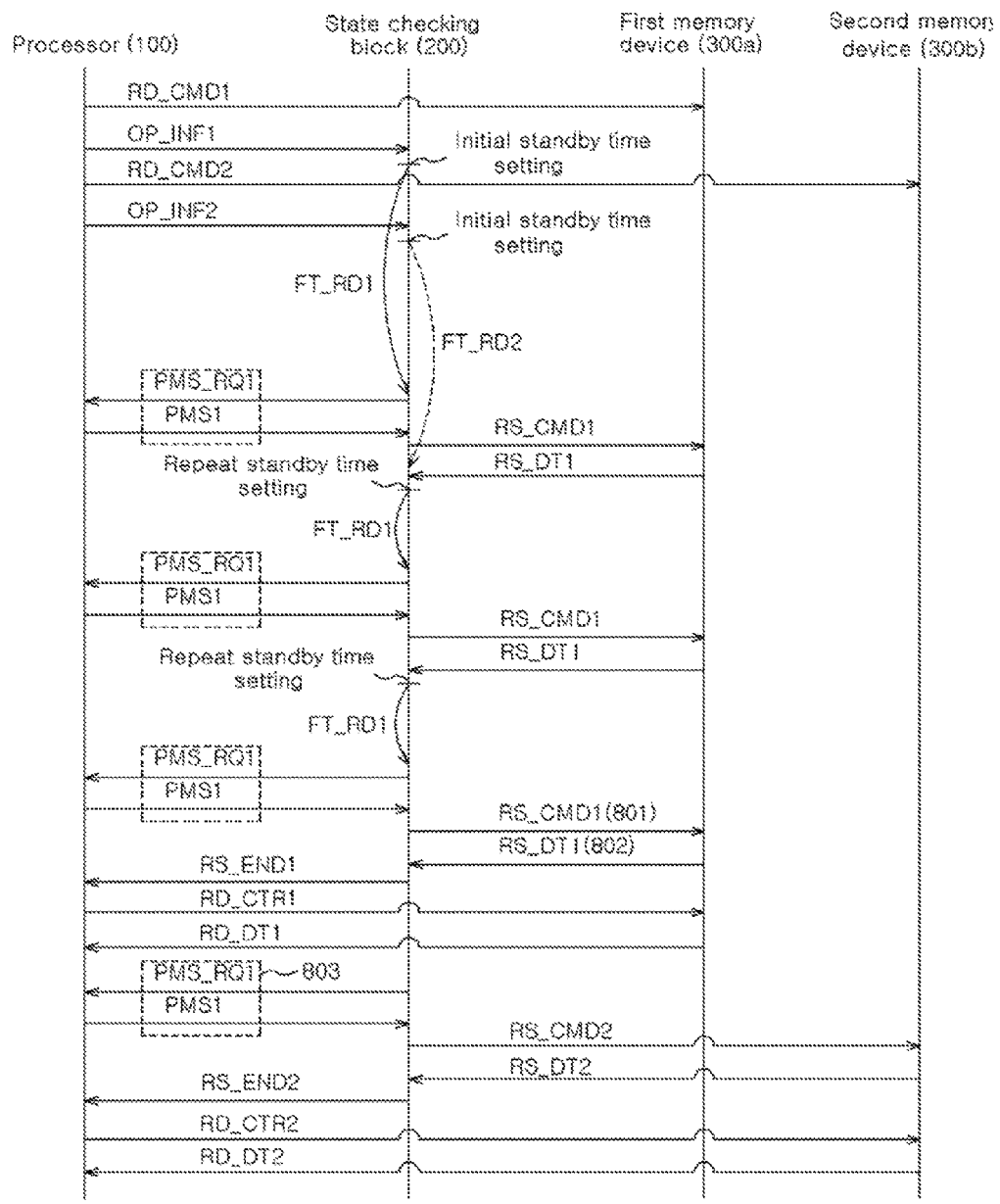
FIG. 8 is a transaction diagram illustrating an in-order operation of a data storage device shown in FIG. 1.

FIG. 8 is a transaction diagram illustrating an in-order operation of the data storage device 10 shown in FIG. 1.

The data storage device 10 may be requested to provide data to an external device (not shown) in the order of the requests from the external device. For example, when the data storage device 10 sequentially receives read requests for first data and second data from the external device, the data storage device 10 may be requested to sequentially transmit the first data and the second data to the external device. When the first data is stored in the first memory device 300a and the second data is stored in the second memory device 300b, the processor 100 may sequentially transmit read operation commands RD_CMD1 and RD_CMD2 to the first and second memory devices 300a and 300b, respectively, as shown in FIG. 8.

During the in-order operation, the state checking block 200 may perform the state read operations, based on the order of the read operation commands RD_CMD1 and RD_CMD2 transmitted to the first and second memory devices 300a and 300b. First, the state checking block 200 may set initial standby times FT_RD1 and FT_RD2 for the respective first and second memory devices 300a and 300b, based on internal operation information OP_INF1 and OP_INF2 which is sequentially transmitted to the state checking block 200 from the processor 100. When the initial standby time FT_RD1 for the first memory device 300a passes, the state checking block 200 may perform the state read operation for the first memory device 300a in substantially the same way as described above with reference to FIG. 7. At this time, even though the initial standby time FT_RD2 for the second memory device 300b passes, the state checking block 200 may not perform the state read operation for the second memory device 300b until the state read operation for the first memory device 300a is completed.

The state checking block 200 may transmit the state read end signal RS_END1 for the first memory device 300a to the processor 100 when it is determined based on first response data RS_DT1 802 for the thirdly transmitted state read command RS_CMD1 801 that the internal read operation of the first memory device 300a is completed. The processor 100 may transmit a first read control signal RD_CTR1 to the first memory device 300a, receive first data RD_DT1 transmitted from the first memory device 300a, and transmit the first data RD_DT1 to the external device.

Since the state read operation for the first memory device 300a is completed, the state checking block 200 may perform a permission process 803 for the second memory device 300b, and may transmit the state read command RS_CMD2 to the second memory device 300b. The state checking block 200 may transmit the state read end signal RS_END2 for the second memory device 300b to the processor 100 when it is determined based on second response data RS_DT2 that the internal read operation of the second memory device 300b is completed. The processor 100 may transmit a second read control signal RD_CTR2 to the second memory device 300b, receive second data RD_DT2 transmitted from the second memory device 300b, and transmit the second data RD_DT2 to the external device.

The state read operation for the second memory device 300b may be in a standby state until the state read operation for the first memory device 300a is completed. For example, the sequencer 260 may store in the second register 500b corresponding to the second memory device 300b information representing the state read operation in the standby state to manage the processes of the state read operations in order.

The permission processes performed between the state checking block 200 and the processor 100 shown in FIG. 8, that is, the processes in which the state checking block 200 and the processor 100 exchange permission request signals PMS_RQ1 and PMS_RQ2 and permission signals PMS1 and PMS2, may be omitted according to an embodiment.

Figure 9:
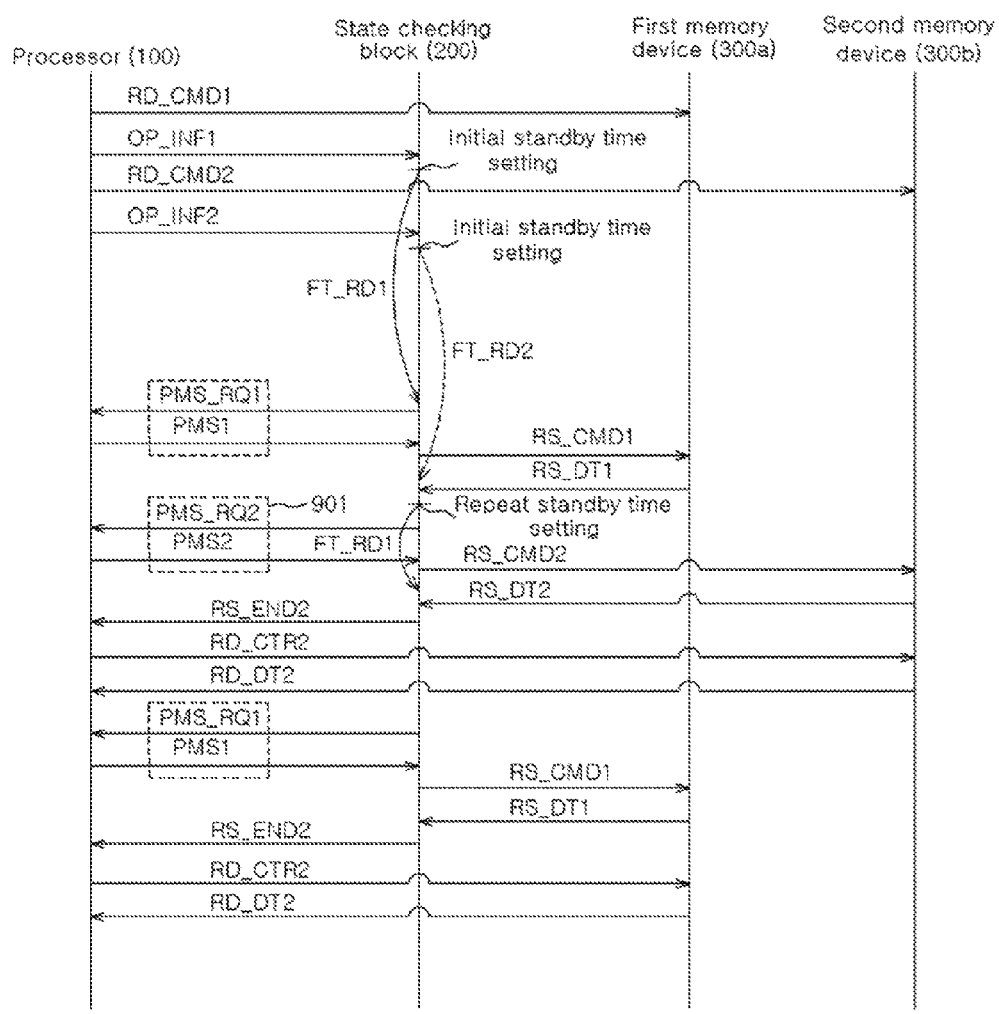
FIG. 9 is a transaction diagram illustrating an out-of-order operation of a data storage device shown in FIG. 1.

FIG. 9 is a transaction diagram illustrating an out-of-order operation of the data storage device 10 shown in FIG. 1.

During the out-of-order operation, the data storage device 10 may provide data to an external device regardless of the order of requests from the external device. For example, even though the data storage device 10 sequentially receives read requests for first data and second data from the external device, it may be allowed to transmit second data prior to the first data to the external device.

When the first data is stored in the first memory device 300a and the second data is stored in the second memory device 300b, the processor 100 may transmit the read operation commands RD_CMD1 and RD_CMD2 to the first and second memory devices 300a and 300b, respectively, as shown in FIG. 9. During the out-of-order operation, the state checking block 200 may perform state read operations for the respective first and second memory devices 300a and 300b, regardless of the order of the read operation commands RD_CMD1 and RD_CMD2 transmitted to the first and second memory devices 300a and 300b.

In detail, the state checking block 200 may set initial standby times FT_RD1 and FT_RD2 for the respective first and second memory devices 300a and 300b based on internal operation information OP_INF1 and OP_INF2 which is sequentially transmitted to the state checking block 200 from the processor 100. When the initial standby time FT_RD1 for the first memory device 300a passes, the state checking block 200 may perform the state read operation for the first memory device 300a in substantially the same way as described above with reference to FIG. 7. When the initial standby time FT_RD2 for the second memory device 300b passes, the state checking block 200 may also perform the state read operation for the second memory device 300b without standby even before the state read operation for the first memory device 300a is completed.

Referring to FIG. 9, unlike the in-order operation described with reference to FIG. 8, the state checking block 200 may perform the state read operation for the second memory device 300b during the repeat standby time for the first memory device 300a. The state 1i checking block 200 may perform a permission process 901 for the second memory device 300b, and may transmit the state read command RS_CMD2 to the second memory device 300b. The state checking block 200 may transmit the state read end signal RS_END2 for the second memory device 300b to the processor 100 when it is determined based on the second response data RS_DT2 that the internal read operation of the second memory device 300b is completed. The processor 100 may transmit the second read control signal RD_CTR2 to the second memory device 300b, receive second data RD_DT2 from the second memory device 300b, and transmit the 25 second data RD_DT2 to the external device prior to the first data RD_DT1.

The permission processes performed between the state checking block 200 and the processor 100 shown in FIG. 9, that is, the processes in which the state checking block 200 and the processor 100 exchange permission request signals PMS_RQ1 and PMS_RQ2 and permission signals PMS1 and PMS2 may be omitted according to an embodiment.

Figure 10:
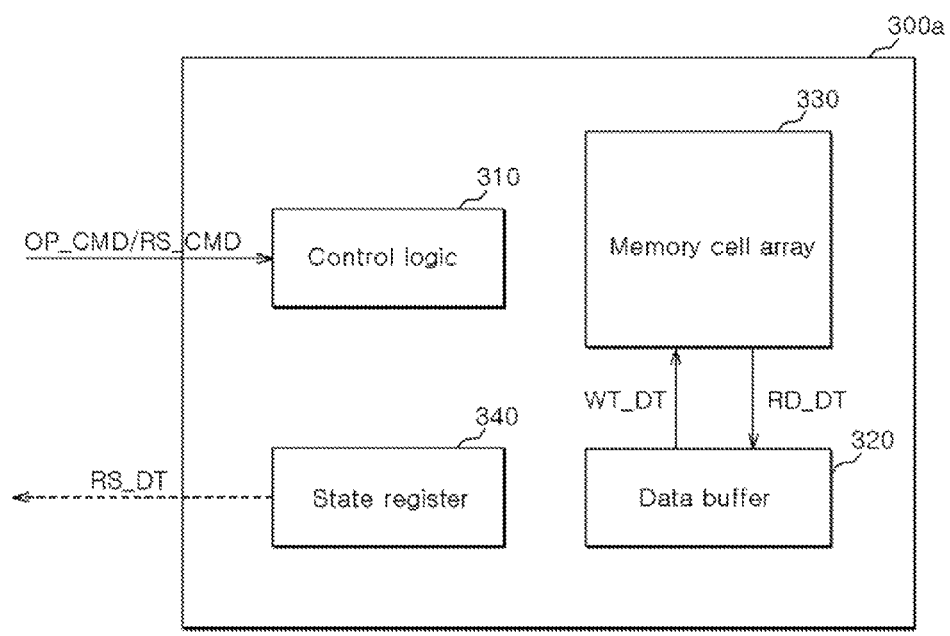
FIG. 10 is a block diagram illustrating a first memory device shown in FIG. 1.

FIG. 10 is a block diagram illustrating the first memory device 300a shown in FIG. 1. The second to $n^{th}$ memory devices 300b to 300n of FIG. 1 may be the same as the first memory device 300a.

The first memory device 300a may include a control logic 310, a data buffer 320, a memory cell array 330, and a state register 340.

The control logic 310 may control the other component elements 320 to 340 in response to the internal operation command OP_CMD transmitted from the processor 100. The control logic 310 may perform a control task in response to the state read command RS_CMD transmitted from the state checking block 200 such that the response data RS_DT stored in the state register 340 is outputted.

The data buffer 320 may temporarily store write data WT_DT to be stored in the memory cell array 330 in a write operation or read data RD_DT read from the memory cell array 330 in a read operation.

The memory cell array 330 may include a plurality of memory cells (not shown), and each of the memory cells may store at least one data bit.

The state register 340 may store information representing whether the internal operation is completed. The state register 340 may store data '0' when the internal operation is being performed, for example, when the write operation for storing the write data WT_DT of the data buffer 320 into the memory cell array 330 is being performed, or when the read operation for outputting the read data RD_DT from the memory cell array 330 to the data buffer 320 is being performed. The state register 340 may store data '1' when the internal operation is completed. The data stored in the state register 340 may be outputted as the response data RS_DT in response to the state read command RS_CMD.

As is apparent from the above descriptions, the data storage device according to an embodiment may transmit a state read command to a memory device under the control of a processor.

While various embodiments have been described above, it will be understood to those skilled in the art that the embodiments described are for example only. Accordingly, the claims should not be limited based on the described embodiments.

What is claimed is:

1. A data storage device comprising:
    a memory device suitable for performing an internal operation in response to an internal operation command; and
    a state checking block suitable for determining whether the internal operation is completed,
    wherein the state checking block comprises:
    a sequencer suitable for setting a standby time based on an internal operation information, and checking passage of the standby time;
    a pattern generation unit suitable for generating a state read command; and
    a main control unit suitable for transmitting the state read command to the memory device based on timing report of the sequencer due to the passage of the standby time.

2. The data storage device according to claim 1, wherein the internal operation information comprises information on a type of the internal operation and an address of the memory device.

3. The data storage device according to claim 1,
    wherein the memory device outputs response data in response to the state read command, and
    wherein the sequencer determines whether the internal operation is completed based on the response data.

4. The data storage device according to claim 3, wherein the sequencer repeatedly sets a repeat standby time based on the internal operation information and transmits the state read command each time the repeat standby time passes until it is determined that the internal operation is completed.

5. The data storage device according to claim 4, wherein the sequencer sets the repeat standby time to be shorter than the initial standby time.

6. The data storage device according to claim 1, further comprising a processor configured to transmit the internal operation command to the memory device, and transmit the internal operation information to the state checking block.

7. The data storage device according to claim 6, wherein the main control unit outputs a permission request signal to the processor, and receives a permission signal from the processor before transmitting the state read command.

* * * * *